May 12, 1970 O. W. HATCHER, JR 3,512,057

SEMICONDUCTOR DEVICE WITH BARRIER IMPERVIOUS TO FAST IONS AND METHOD OF MAKING

Filed March 21, 1968

INVENTOR.

OWEN W. HATCHER JR.

BY Flehr, Hohbach, Test, Albritton & Herbert

ATTORNEYS

United States Patent Office 3,512,057
Patented May 12, 1970

3,512,057

SEMICONDUCTOR DEVICE WITH BARRIER IMPERVIOUS TO FAST IONS AND METHOD OF MAKING

Owen W. Hatcher, Jr., Sunnyvale, Calif., assignor to Teledyne Systems Corporation, Hawthorne, Calif., a corporation of California Filed Mar. 21, 1968, Ser. No. 715,069
Int. Cl. H01l *11/00, 11/14*
U.S. Cl. 317—235 1 Claim

ABSTRACT OF THE DISCLOSURE

A semiconductor device includes an active inset region in one surface with a silicon dioxide passivating layer overlaying the surface including an aperture which exposes a predetermined area of the inset region. The aperture has a sidewall of a predetermined height. An additional phosphorus glass layer, which is impervious to fast diffusing ions from aluminum contacts, overlays the passivating layer and extends down the sidewall of the aperture into contact with the inset region to form an aperture exposing an area of the inset region smaller than the predetermined area. Thus, an impervious barrier to fast ions is provided between an aluminum contact placed in contact with the inset region through the smaller aperture and the silicon dioxide passivating layer.

BACKGROUND OF THE INVENTION

The present invention is directed to an insulated gate field effect transistor and a method of making the same and more specifically to protect the transistor from ions that diffuse fast in the silicon dioxide layers.

In the past, transistors have been sealed from the fast ions mentioned above by a layer such as phosphorus glass which is impervious to these ions. This has normally been placed over the silicon dioxide passivating layer on the semiconductive substrate.

The fast ion problem is especially troublesome in field effect transistors where they may diffuse through the silicon dioxide passivating layer into the gate regions and cause a shift in the gate-source voltage necessary to obtain a given source to drain current. The use of phosphorus glass in an attempt to prevent this phenomenon on prior devices has failed to be as effective as desired since the apertures etched in the silicon dioxide to expose the active source or drain regions have also exposed the sidewalls of silicon dioxide. This has allowed the passage of fast ions through these sidewalls. Thus, device reliability was degraded.

SUMMARY OF THE INVENTION AND OBJECTS

It is, therefore, a general object of this invention to provide an improved semiconductive device and method of making which inhibits fast ions from diffusing into its active regions.

It is a more specific object of the invention to provide an impervious barrier in a field effect type transistor between a fast ion source such as an aluminum contact and the active regions of the transistor.

In accordance with the above objects, the method of making such a semiconductive device comprises the steps of providing a semiconductive substrate of one conductivity type with a region of the opposite conductivity type inset into one surface of the substrate. A passivating layer, such as silicon dioxide, is grown on the surface and an additional layer overlays the passivating layer. This additional layer is composed of a material substantially impervious to fast diffusing ions. Both the additional layer and passivating layer are selectively etched to expose the predetermined area of the inset region. Thereafter, impervious material is again deposited on the predetermined area. This material is selectively etched to expose an area of the inset region which is smaller than the predetermined area. Thereafter, a conductive layer is deposited on the smaller exposed area to form an ohmic contact with the exposed region.

From a device standpoint, the invention includes a semiconductive substrate of one conductivity type inset into one surface of the substrate. A passivating layer overlays the surface and includes an aperture exposing a predetermined area of the inset region. This aperture has a sidewall of predetermined height. An additional layer impervious to fast diffusing ions overlays the passivating layer and extends down the sidewall into contact with the inset region to form an aperture exposing an area of such region smaller than the predetermined area.

BRIEF DESCRIPTION OF THE DRAWINGS

FIG. 7 is a cross-sectional view of a semiconductive device embodying the present invention.

DESCRIPTION OF PREFERRED EMBODIMENT

Figure 7:
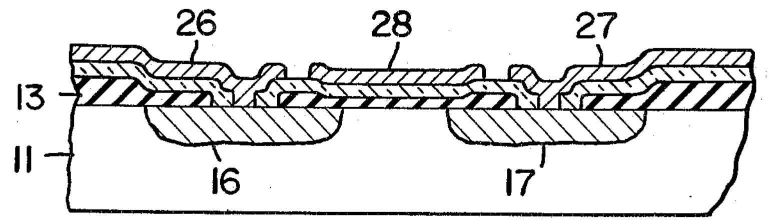

In describing the present invention, a metaloxide-silicon type field effect transistor is shown in FIG. 7. However, it should be understood that the invention is applicable to any semiconductive device having a substrate with an active region.

Figure 1:
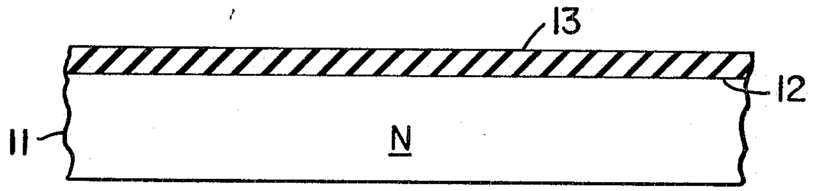
FIGS. 1 through 7 are cross-sectional views of a semiconductive device illustrating the method of the present invention.
Figure 2:
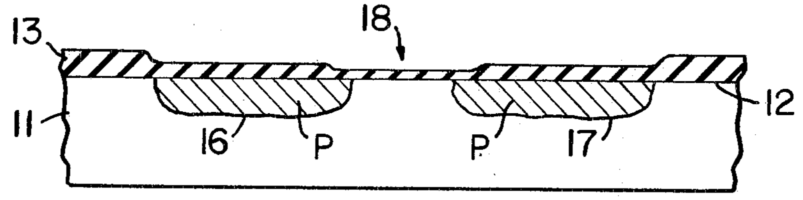

The method for the construction of the present invention is first described. As shown in FIG. 1, a silicon semiconductive substrate 11 of N-type conductivity is polished on its top surface 12 and a passivating layer of silicon dioxide 13 is formed thereon. Next, the layer 13 is photomasked, source and drain regions 16 and 17 are diffused, and the silicon dioxide is allowed to regrow to cover the inset source and drain region 16 (FIG. 2). Thereafter, the gate region shown at 18 is processed to provide the proper thickness of silicon dioxide for the later deposition of an aluminum metal gate layer.

Figure 3:
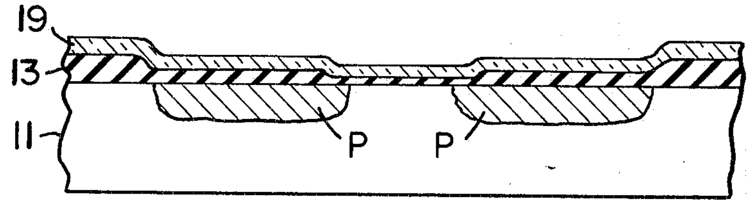
Figure 4:
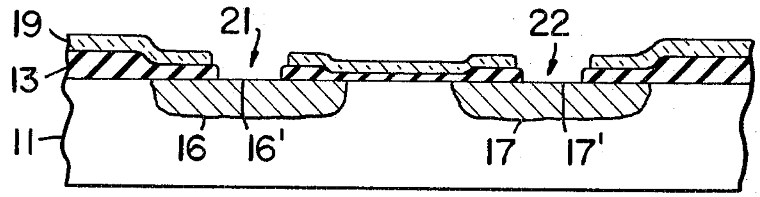

As illustrated in FIG. 3, the device of FIG. 2 has grown on it a phosphorus glass layer 19 which is impervious to fast ions such as would be produced by an aluminum contact on the device. This is accomplished by providing phosphor in an oxygen atmosphere which then reacts with the silicon dioxide passivating surface. The device is photomasked and apertures 21 and 22 etched out to expose predetermined areas 16' and 17' (FIG. 4). Apertures 21 and 22 have as sidewalls the passivating layer 13 which, at the apertures, have a predetermined height or thickness.

Figure 5:
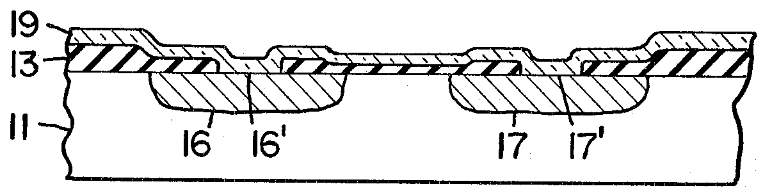

As illustrated in FIG. 5, phosphorus glass is deposited on the exposed areas 16' and 17' at such a temperature that the exposed source and drain contact areas 16' and 17' remain of P-type conductivity. In this deposition, phosphor is vaporized in an oxygen atmosphere and the two elements react with the silicon substrate.

Figure 6:
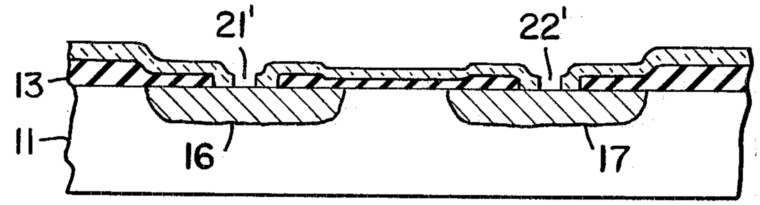

In order to provide source and drain contact areas, layer 19, as illustrated in FIG. 5, is photomasked and etched to produce apertures 21' and 22' (FIG. 6). Since these apertures are smaller than apertures 21 and 22 they also provide an impervious barrier at the walls of the apertures 21 and 22 formed by the silicon dioxide. Therefore, the entire silicon dioxide surface is now covered by the impervious phosphorus glass layer.

As a final step, aluminum is evaporated, as illustrated in FIG. 7, at 26 and 27, to form source and drain contacts and at 28 to form a gate contact.

As is apparent from FIG. 7, the invention provides for complete isolation of the aluminum contacts from the silicon dioxide layer 13 to prevent the fast diffusion of ions which will tend to shift the gate source voltage and degrade the reliability of the semiconductor device. Thus, the present invention provides, in general, an improved semiconductor device which has an effective barrier against fast ions.

I claim:

1. A semiconductor device comprising, a semiconductive substrate of one conductivity type, a region of opposite conductivity type inset into one surface of said substrate, a passivating layer overlaying said surface such layer including an aperture exposing a predetermined area of said inset region such aperture having a sidewall of predetermined height, an additional layer overlaying said passivating layer and extending down said side wall into contact with said inset region to form an aperture exposing an area of such region smaller than said predetermined area and a conductive layer deposited on said smaller exposed area said layer serving as an ion source said additional layer including material impervious to ions for said source.

References Cited

UNITED STATES PATENTS

| | | | |
|---|---|---|---|
| 3,330,694 | 7/1969 | Black et al. | 117—201 |
| 3,392,312 | 7/1969 | Carman | 317—234 |
| 3,247,428 | 4/1966 | Perri et al. | 317—234 |
| 3,300,339 | 1/1967 | Perri et al. | 117—215 |
| 3,334,281 | 8/1967 | Ditrick | 317—235 |
| 3,343,049 | 9/1967 | Miller et al. | 317—234 |

JOHN HUCKERT, Primary Examiner

M. H. EDLOW, Assistant Examiner

U.S. Cl. X.R.

117—212; 317—234